(12) United States Patent
Yip et al.

(10) Patent No.: US 7,645,639 B2
(45) Date of Patent: Jan. 12, 2010

(54) PACKAGING OF INTEGRATED CIRCUITS TO LEAD FRAMES

(75) Inventors: Tian Siang Yip, Singapore (SG); Bee Ngoh Kee, Singapore (SG)

(73) Assignee: Infineon Technologies AG, Munich (DE)

( * ) Notice: Subject to any disclaimer, the term of this patent is extended or adjusted under 35 U.S.C. 154(b) by 324 days.

(21) Appl. No.: 11/660,184

(22) PCT Filed: Aug. 26, 2004

(86) PCT No.: PCT/SG2004/000259

§ 371 (c)(1),
(2), (4) Date: Feb. 14, 2007

(87) PCT Pub. No.: WO2006/022591

PCT Pub. Date: Mar. 2, 2006

(65) Prior Publication Data

US 2007/0252248 A1 Nov. 1, 2007

(51) Int. Cl.
*H01L 23/495* (2006.01)
(52) U.S. Cl. ............... 438/123; 257/666; 257/E23.078
(58) Field of Classification Search ............... 257/666, 257/E23.078; 438/123
See application file for complete search history.

(56) References Cited

U.S. PATENT DOCUMENTS

| 4,782,589 | A |   | 11/1988 | Dennis |
| 4,855,866 | A | * | 8/1989  | Imamura et al. ......... 361/306.2 |
| 5,307,929 | A |   | 5/1994  | Seidler |
| 5,998,866 | A |   | 12/1999 | Ochi et al. |
| 6,294,824 | B1 | * | 9/2001 | Brooks et al. ............... 257/666 |

FOREIGN PATENT DOCUMENTS

| GB | 2 274 021 A | 7/1994 |
| JP | 03011760 | 1/1991 |

* cited by examiner

*Primary Examiner*—Leonardo Andújar
*Assistant Examiner*—Krista Soderholm
(74) *Attorney, Agent, or Firm*—Slater & Matsil, L.L.P.

(57) ABSTRACT

A lead frame (200) for housing an integrated circuit is disclosed comprising a main member (220) and an engagement portion (230) for receiving an integrated circuit (210). The integrated circuit (210) is located at the engagement portion (230) and engaged with the lead frame through resilient engagement with the first and second engagement members (222, 223). The first and second engagement members (222, 223) which depend from the main member, secure the integrated to the lead frame by engaging in resilient contact respective opposed surfaces of the integrated circuit. The integrated circuit is engaged to the lead frame by clipping into it into position between the engagement members. There is no need for a gluing process unlike conventional lead frame designs which where the integrated circuit is attached to a lead frame by gluing it onto the die paddle.

23 Claims, 3 Drawing Sheets

PACKAGING OF INTEGRATED CIRCUITS TO LEAD FRAMES

FIELD OF THE INVENTION

The present invention relates to methods of packaging an integrated circuit to a lead frame, to lead frames suitable for use in the methods and to the combinations of integrated circuits and lead frames produced using the methods.

BACKGROUND OF THE INVENTION

Lead frames are commonly used as a substrate for the packaging of integrated circuits. FIG. 1 illustrates a conventional lead frame 100 comprising a central die paddle 101 adapted for receiving an integrated circuit 110 and a plurality of leads 102 encircling the die paddle. The leads 102 which serve as electrical contacts are spaced away from the die paddle 101. In well known methods, an integrated circuit 110 is attached onto the die paddle 101 by dispensing a layer of epoxy glue 120 onto the die paddle 101 and attaching the lower surface of the integrated circuit to it. The epoxy glue is then cured to hold the integrated circuit securely in place. Following this, wire bonds are formed to electrically connect the electrical contacts located on the upper surface of the integrated circuit (not shown) with respective leads 102 of the lead frame. The integrated circuit 110, die paddle 101 and wire bonds are subsequently encapsulated in an electrically insulating resin and the leads 102 cut leaving portions of the leads extending out of the resin body so that they may be connected to further circuitry.

Unfortunately, the above described conventional lead frame design 100 and packaging method deployed suffers from a number of problems. First of all, the dispensing of epoxy glue and placement of the integrated circuit 110 has to be carefully controlled in order to avoid problems such as excessive glue bleed, glue void and die tilt. For example, if the amount of epoxy glue dispensed is too great, the epoxy glue may leak from beneath the integrated circuit 110 and cover some of the electrical contacts of the integrated circuit or inner ends of the leads 102 where the connecting wires are bonded. In this case, it may be impossible to form reliable wire bonds between the electrical contacts of the integrated circuit and the leads of the lead frame. In addition to this, the epoxy glue cure process also introduces additional problems such as out-gassing of parts used in the glue cure process, glue cure oven contamination and the need to control complex glue curing profiles. Aside from the above packaging problems, there are also concerns from the reliability point of view as the conventional integrated circuit packages formed are found to be susceptible to delamination effects during subsequent use. This is because delamination between the resin body and die paddle are often observed after the package has been subjected to accelerated reliability testing such as temperature cycling and pressure cooker test. The glue region 120a in particular is especially prone to delamination.

As a result of these problems associated with the conventional lead frame design and packaging methods, the packaging yield and reliability of the resulting integrated circuit packages formed are severely compromised. It is an object of the invention to provide a lead frame design and packaging method which alleviates these problems and/or provides the general public with a useful choice.

SUMMARY OF THE INVENTION

In accordance with a first aspect of the present invention, there is provided a lead frame comprising a main member, an engagement portion within the main member for receiving an integrated circuit and engagement means depending from the main member. The integrated circuit being located at the engagement portion through resilient engagement with the engagement means.

Preferably the engagement means comprise a plurality of first and second engagement members adapted to resiliently engage respective opposed surfaces of the integrated circuit. The first and second engagement members are arranged such that an engaged integrated circuit has an interference fit with the engagement members.

In one embodiment, the total available contact area of the second engagement members exceeds the total available contact area of the first engagement members. Preferably, the arrangement of the lead frame being such that an individual contact area of each second engagement member is greater than an individual contact area of each first engagement member.

In accordance with a second aspect of the present invention, an integrated circuit is packaged to a lead frame by providing a lead frame comprising a main member, an engagement portion within the main member for receiving an integrated circuit and engagement means depending from the main member, locating an integrated circuit at the engagement portion and engaging the integrated circuit to the lead frame through resilient engagement with the engagement means.

The lead frame of the present invention and the method of packaging an integrated circuit to it departs from conventional lead frame designs. Conventional lead frame designs comprise a die paddle and epoxy glue is used to attach the integrated circuit to the die paddle. Accordingly, since the present invention removes the need for a die paddle and gluing process, the problems associated with integrated circuit attachment and glue cure are also eliminated. Furthermore, the removal of the die paddle also improves the reliability of the resulting integrated circuit package tremendously as the delamination effects between the resin body and die paddle/glue region are also eradicated.

BRIEF DESCRIPTION OF THE DRAWINGS

An embodiment of the invention will now be described, by way of example, with reference to the accompanying drawings in which.

DETAILED DESCRIPTION OF THE PREFERRED EMBODIMENT OF THE INVENTION

Figure 1:
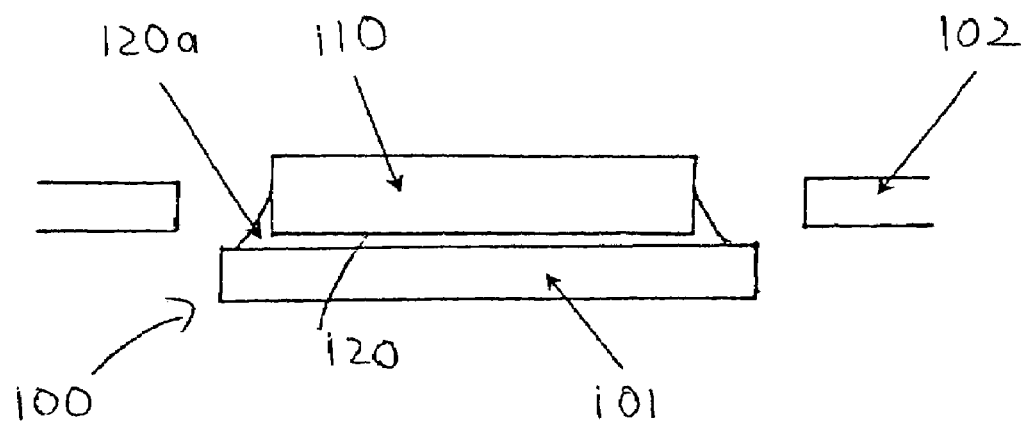
FIG. 1 shows the cross-sectional view of an integrated circuit attached to a lead frame having a known design.
Figure 2:
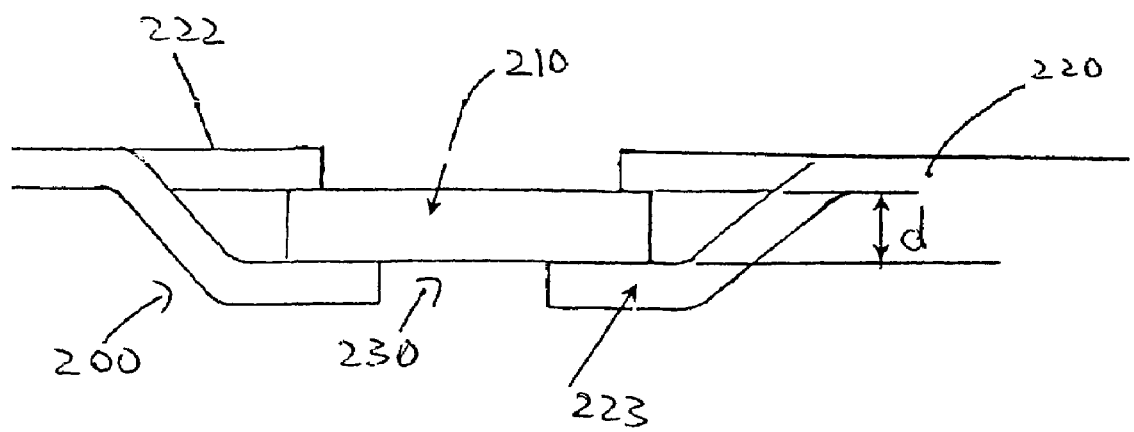
FIG. 2 shows the cross-sectional view of an integrated circuit clipped onto a lead frame which is a first embodiment of the invention.
Figure 3:
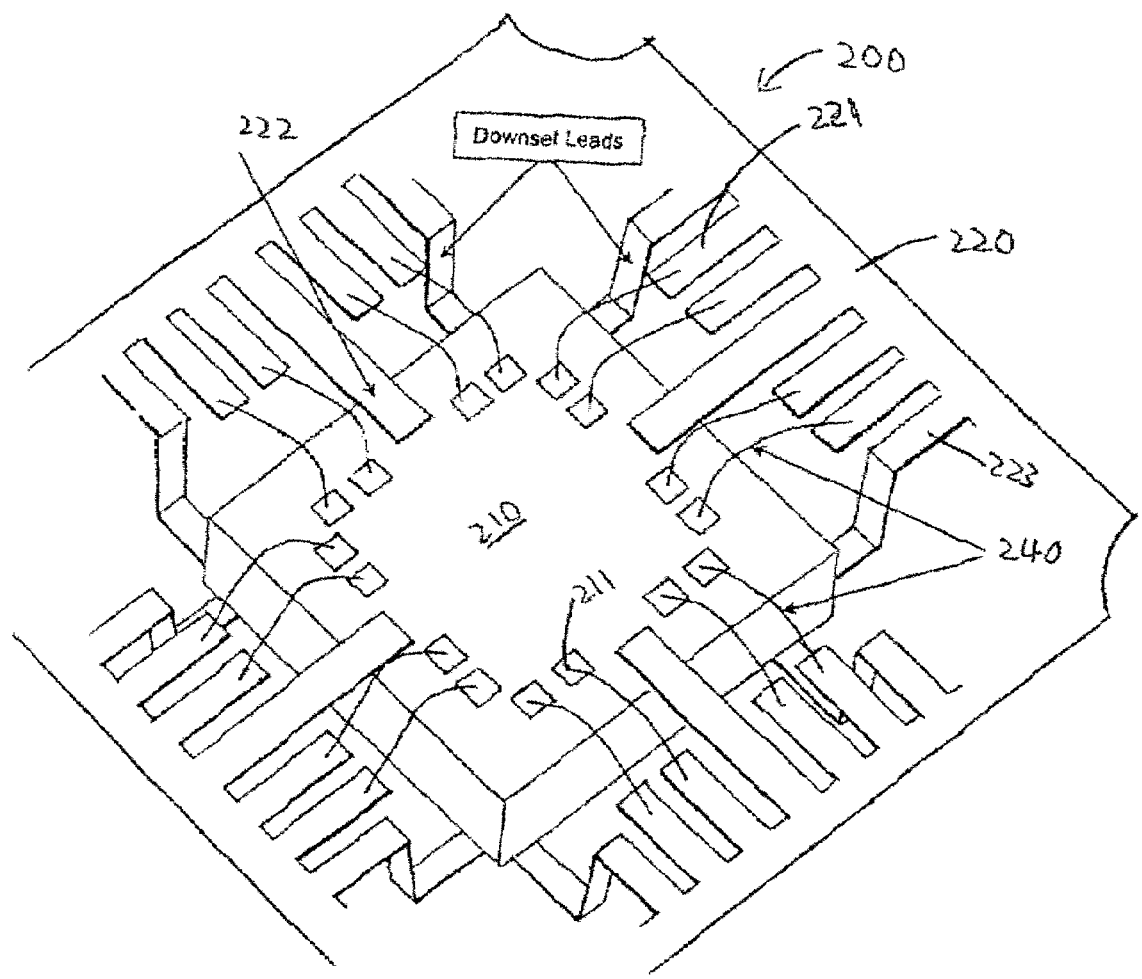
FIG. 3 shows the top view of an integrated circuit clipped onto the lead frame of FIG. 2 with wire bonds being formed between the electrical contacts of the integrated circuit and the corresponding contact members of the lead frame.

The present invention addresses the problems with the conventional lead frame design by eliminating both the die paddle and the gluing process. FIGS. 2 and 3 illustrate a lead frame 200 in accordance with one embodiment of the invention. FIG. 2 shows a cross-sectional view of the lead frame 200 with an integrated circuit 210 mounted on it while FIG. 3 shows the top view. The lead frame 200 includes a central aperture 230 for receiving an integrated circuit 210 and a main member 220 surrounding the central aperture 230. The main member 220 has a set of electrical contact members 221 extending from the main member in a direction towards the central aperture 230. During the packaging process, wire bonds 240 are formed to electrically connect the contact members 221 with corresponding electrical contacts 211 located on the upper surface of the integrated circuit 210. In addition to this, the main member 220 also has a set of first engagement members 222 and a set of second engagement members 223 extending radially inwards from the main member 220 towards the central aperture 230. The first and second engagement members 222, 223 are used to fasten the integrated circuit 210 to the lead frame 220 and have a longer span length wise as compared to the contact members 221. As shown in FIGS. 2 and 3, the ends of the first engagement members 222 remote from the main member engage the upper surface of the integrated circuit 210. Meanwhile, a portion of the second engagement members 223 is downset so that the ends of the second engagement members 223 remote from the main member 220 engage the lower surface of the integrated circuit 210. By contrast, the contact members 221 which have a shorter span than the engagement members are arranged to be spaced apart from the integrated circuit 210. Since the engagement members engage a surface of the integrated circuit, they also serve as a heat sink which dissipates heat away from the integrated circuit.

The vertical distance d between the lower surface of the first engagement members 222 and the upper surface of the second engagement members 223 is arranged to be slightly smaller than the thickness of the integrated circuit to be fastened. This causes the engagement members to exert a slight pressure on the respective upper and lower surfaces of the integrated circuit 210 thereby ensuring that the engaged integrated circuit 210 is securely fastened by having an interference fit with the engagement members. In a preferred embodiment, the second engagement members 223 engage a portion of the surface near the corners of the integrated circuit with a first engagement member 223 interposed between them.

Preferably, each second engagement member 223 is arranged to engage a larger surface of the integrated circuit than a corresponding first engagement member 222. For example, in a preferred embodiment shown in FIG. 2, the second engagement members 223 have a longer lateral span and extend further inward from the edge of the integrated circuit 210 to engage a larger surface area of the integrated circuit 210 than the first engagement members 222. Since the second engagement members 223 engage the lower inactive surface of the integrated circuit 210, this arrangement results in better support for the integrated circuit 210 without affecting the amount of surface area available for electronic circuitry.

Figure 4:
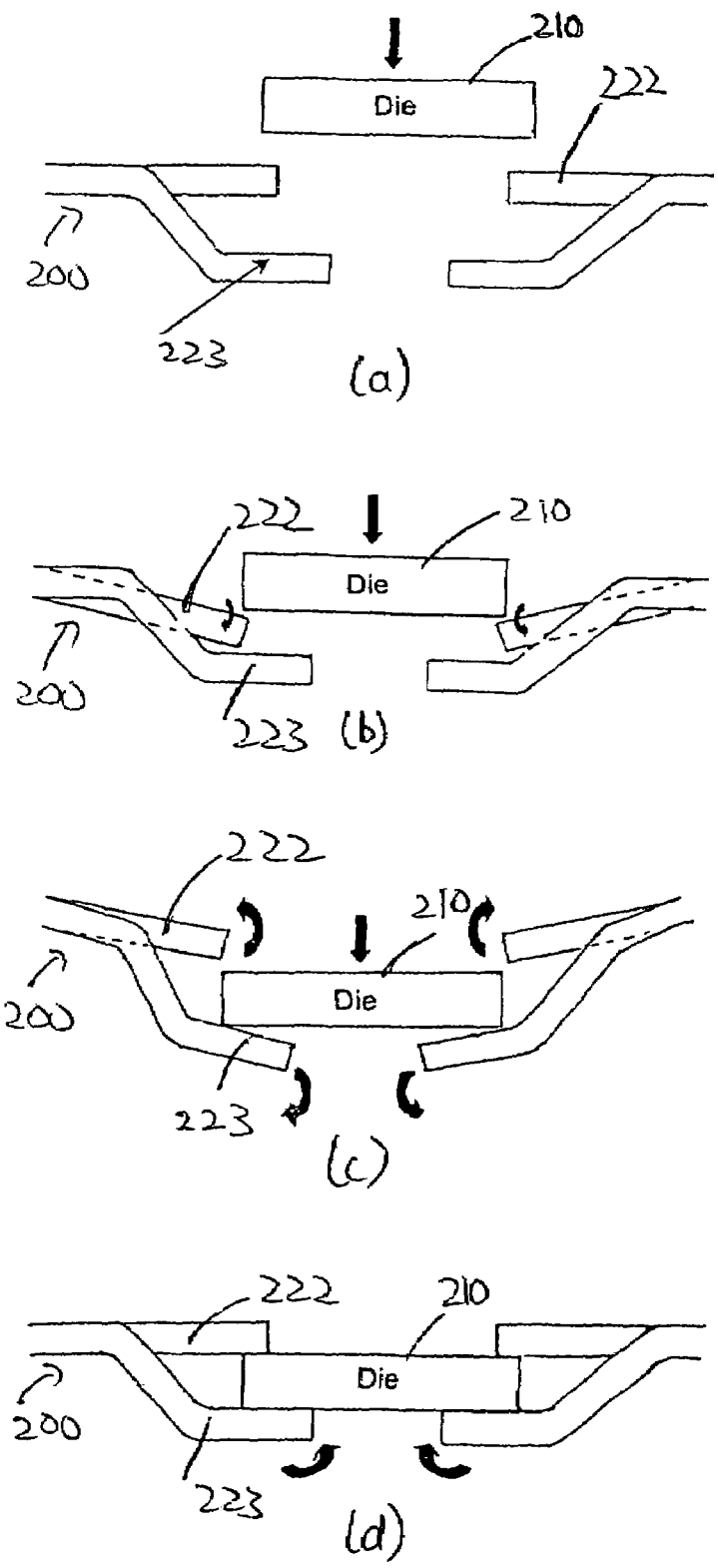
FIG. 4, which is composed of FIGS. 4(a) to 4(d), shows the process of attaching an integrated circuit to the lead frame of FIGS. 2 and 3.

The process of fastening an integrated circuit to the lead frame of FIGS. 2 and 3 is illustrated in FIG. 4. First of all in FIG. 4(a), a bonding arm in the form of a die collet (not shown) connected to a vacuum source holds the integrated circuit to be fastened by suction and positions the integrated circuit such that it is in register with the central aperture of a lead frame 200. The die collet then lowers the integrated circuit downwards. As shown in FIG. 4(b), the lower surface of the integrated circuit first touches the upper surface of the first engagement members 222, pushing the first engagement members 222 downwards as the integrated circuit 210 is lowered. The lowering of the integrated circuit 210 continues with the first engagement members 222 being deflected downwards until the integrated circuit 210 has travelled past the first engagement members 222 as shown in FIG. 4(c). When this happens, the first engagement members 222 which are made of a resilient material spring back to their original position by cantilever action. In one embodiment, the lead frame is made from a copper alloy (such as C19400, C70250, C19210) or alloy 42. Alternatively, other lead frame materials which are resilient in terms of being able to exhibit cantilever effect may also be used. Since existing lead frames materials generally exhibit these properties, the described embodiment can be implemented without having to develop new lead frame materials.

At this point, the lower surface of the integrated circuit 210 is in contact with the upper surface of the second engagement members 222 and as evident from FIG. 4(c), the second engagement members 223 are also deflected downwards when the integrated circuit 210 is lowered past the first engagement members 222. In FIG. 4(d), the die collet subsequently releases the integrated circuit 210 from suction and the second engagement members 223 return to their original position by cantilever action. The integrated circuit 210 is accordingly secured to the lead frame 200 with the first and second engagement members 222, 223 engaging the upper and lower surfaces of the integrated 210 respectively. Preferably, the downward deflection of the second engagement members 223 should be slight so that the integrated circuit 210 does not shift sideways when the second engagement members 223 return to their original position.

After the integrated circuit 210 has been secured to the lead frame 200, wire bonds 240 are formed to electrically connect the electrical contacts 211 located on the upper surface of the integrated circuit with the respective contact members 221. The top view of the resulting arrangement is shown in FIG. 3. An encapsulation process is then carried out to encase the integrated circuit 210 and wire bonds 240 in an electrically insulating material.

Although the lead frame 200 illustrated in FIG. 3 shows a first engagement member 222 and two second engagement members 223 located on each side of the integrated circuit 210, other configurations of the lead frame are also possible. For example, the number of engagement members may be varied or the engagement members may be located on the corners instead of at the sides of the integrated circuit.

While the invention has been particularly shown and described with reference to various embodiments, it will be recognized by those skilled in the art that modifications and changes may be made to the present invention without departing from the scope thereof. The scope of the invention should therefore be determined not with reference to the above description but with reference to the appended claims.

The invention claimed is:

1. A method of packaging an integrated circuit having electrical contacts on a first surface and an inactive second surface opposite the first surface on a lead frame, the method comprising:

providing a lead frame comprising a main member, an engagement portion comprising a recess within the main member for receiving an integrated circuit and a plurality of first and second engagement members depending from the main member, the engagement members being arranged to resiliently engage the integrated circuit, with the first engagement members contacting the first surface of the integrated circuit and the second engagement members contacting the second surface of the integrated circuit, total available contact area of the second engagement members exceeding total available contact area of the first engagement members;

locating an integrated circuit at the engagement portion; and engaging the integrated circuit to the lead frame through resilient engagement with the engagement members by deforming the first engagement members to clip the integrated circuit into the engagement portion, where the first engagement members recover.

2. A method according to claim 1, wherein the first and second engagement members are arranged such that an engaged integrated circuit has an interference fit with said engagement members.

3. A method according to claim 1 wherein the number of second engagement members exceeds the number of first engagement members.

4. A method according to claim 3 wherein for each side of the engaged integrated circuit there is located two second engagement members and a first engagement member, said first engagement member disposed midway between the second engagement members, with said second engagement members disposed adjacent ends of each side.

5. A method according to claim 1, wherein an individual contact area of each second engagement member is greater than an individual contact area of each first engagement member.

6. A method according to claim 1, further comprising the steps of:
connecting the electrical contacts on the first surface of the engaged integrated circuit with respective contact members of the lead frame; and
encapsulating the engaged integrated circuit in an electrically insulating material.

7. A method of packaging an integrated circuit having electrical contacts on a first surface and an inactive second surface opposite the first surface on a lead frame, the method comprising:
providing a lead frame comprising a main member, an engagement portion within the main member for receiving an integrated circuit and a plurality of first and second engagement members depending from the main member, the engagement members being arranged to resiliently engage the integrated circuit, with the first engagement members contacting the first surface of the integrated circuit and the second engagement members contacting the second surface of the integrated circuit, a total available contact area of the second engagement members exceeding a total available contact area of the first engagement members;
locating an integrated circuit at the engagement portion by positioning the integrated circuit in register with the engagement portion; and
engaging the integrated circuit to the lead frame through resilient engagement with the engagement members, the engaging comprising:
biasing the integrated circuit past the first engagement members until said first engagement members resiliently recover;
contacting with the second engagement members; and
releasing the integrated circuit and engaging the integrated circuit in an interference fit with the first engagement members engaging the first surface of the integrated circuit and the second engagement members engaging the second surface of the integrated circuit.

8. A method according to claim 7 wherein the engagement portion comprises an aperture.

9. A method according to claim 7 wherein the engagement portion is a recess.

10. A method according to claim 7 wherein the engagement portion is coplanar with a plane defined by the lead frame.

11. A method according to claim 7, wherein a number of second engagement members exceeds a number of first engagement members.

12. A method according to claim 11, wherein for each side of the engaged integrated circuit there is located two second engagement members and a first engagement member, said first engagement member disposed midway between the second engagement members, with said second engagement members disposed adjacent ends of each side.

13. A method according to claim 7, wherein an individual contact area of each second engagement member is greater than an individual contact area of each first engagement member.

14. A method according to claim 7, further comprising:
connecting the electrical contacts on the first surface of the engaged integrated circuit with respective contact members of the lead frame; and
encapsulating the engaged integrated circuit in an electrically insulating material.

15. A method of packaging an integrated circuit having electrical contacts on a first surface and an inactive second surface opposite the first surface on a lead frame, the method comprising:
providing a lead frame comprising a main member, an engagement portion within the main member and a plurality of first and second engagement members depending from the main member;
positioning an integrated circuit in register with the engagement portion;
biasing the integrated circuit past the first engagement members until said first engagement members resiliently recover;
contacting the integrated circuit with the second engagement members; and
releasing the integrated circuit so that the integrated circuit is engaged in an interference fit with the first engagement members engaging a first surface of the integrated circuit and the second engagement members engaging a second surface of the integrated circuit.

16. The method of claim 15, wherein a total available contact area of the second engagement members exceeds a total available contact area of the first engagement members.

17. The method of claim 15, wherein the engagement portion comprises an aperture.

18. The method of claim 15, wherein the engagement portion is a recess.

19. The method of claim 15, wherein the engagement portion is coplanar with a plane defined by the lead frame.

20. The method of claim 15, a number of second engagement members exceeds a number of first engagement members.

21. The method of claim 20, wherein for each side of the engaged integrated circuit there is located two second engagement members and a first engagement member, the first engagement member disposed midway between the second engagement members, with the second engagement members disposed adjacent ends of each side.

22. The method of claim 15, wherein an individual contact area of each second engagement member is greater than an individual contact area of each first engagement member.

23. The method of claim 15, further comprising:
connecting electrical contacts on the first surface of the engaged integrated circuit with respective contact members of the lead frame; and
encapsulating the engaged integrated circuit in an electrically insulating material.

* * * * *